United States Patent
Huang

(10) Patent No.: US 9,473,338 B2
(45) Date of Patent: Oct. 18, 2016

(54) RECEIVER, TRANSMITTER, FEEDBACK DEVICE, TRANSCEIVER AND SIGNAL PROCESSING METHOD

(71) Applicant: HUAWEI TECHNOLOGIES CO., LTD., Shenzhen, Guangdong (CN)

(72) Inventor: Baoping Huang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 30 days.

(21) Appl. No.: 14/474,601

(22) Filed: Sep. 2, 2014

(65) Prior Publication Data

US 2014/0369442 A1    Dec. 18, 2014

Related U.S. Application Data

(63) Continuation of application No. 13/553,235, filed on Jul. 19, 2012, now Pat. No. 8,854,989, which is a continuation of application No. PCT/CN2011/070420, filed on Jan. 20, 2011.

(30) Foreign Application Priority Data

Jan. 20, 2010   (CN) .......................... 2010 1 0000798

(51) Int. Cl.
    *H04L 27/12*      (2006.01)
    *H04B 1/04*      (2006.01)
    (Continued)

(52) U.S. Cl.
    CPC ............. *H04L 27/12* (2013.01); *H04B 1/0475* (2013.01); *H04L 27/14* (2013.01); *H04L 27/26* (2013.01);
    (Continued)

(58) Field of Classification Search
    CPC ....................................................... H04L 27/12
    See application file for complete search history.

(56) References Cited

U.S. PATENT DOCUMENTS

| 5,430,711 A * | 7/1995 | Yamada .................. H04J 4/005 370/206 |
| 6,625,422 B1 | 9/2003 | Haruyama |

(Continued)

FOREIGN PATENT DOCUMENTS

| CN | 1529522 | 9/2004 |
| CN | 1716825 | 1/2006 |

(Continued)

OTHER PUBLICATIONS

U.S. Office Action dated Feb. 13, 2014 in co-pending U.S. Appl. No. 13/553,235.

(Continued)

*Primary Examiner* — Brian D Nguyen
*Assistant Examiner* — Toan Nguyen
(74) *Attorney, Agent, or Firm* — Staas & Halsey LLP

(57) ABSTRACT

The present invention provides a receiver, a transmitter, a transmitter feedback device, and corresponding methods. The feedback device includes: a multi-channel frequency selection band-pass circuit, configured to receive a multi-frequency band feedback signal, and output a feedback signal of each frequency band in a time-division manner; a feedback local oscillator, configured to provide feedback local oscillation corresponding to each frequency band in a time-division manner; a mixer, configured to mix the feedback signal of each frequency band from the multi-channel frequency selection band-pass circuit and the feedback local oscillation corresponding to each frequency band from the feedback local oscillator, and output an intermediate frequency signal of each frequency band in a time-division manner. A solution in which only one set of signal processing channels is used to process the signals of multiple frequency bands in the uplink, the downlink or both the uplink and downlink is provided.

13 Claims, 12 Drawing Sheets

(51) Int. Cl.
*H04L 27/36* (2006.01)
*H04L 27/14* (2006.01)
*H04L 27/26* (2006.01)
*H04L 27/00* (2006.01)

(52) U.S. Cl.
CPC .......... *H04L 27/364* (2013.01); *H04L 27/368* (2013.01); *H04B 2001/0433* (2013.01); *H04L 2027/002* (2013.01); *H04L 2027/0016* (2013.01)

(56) References Cited

U.S. PATENT DOCUMENTS

| | | | |
|---|---|---|---|
| 6,763,072 B1* | 7/2004 | Matsui | H04L 27/2627 375/260 |
| 6,888,789 B1* | 5/2005 | Sakoda | H04L 5/0007 370/204 |
| 2002/0181611 A1 | 12/2002 | Kim | |
| 2002/0196860 A1* | 12/2002 | Ohtaki | H03H 17/04 375/260 |
| 2003/0053552 A1 | 3/2003 | Hongo et al. | |
| 2003/0072393 A1* | 4/2003 | Gu | H03C 3/40 375/322 |
| 2003/0174783 A1 | 9/2003 | Rahman et al. | |
| 2005/0014476 A1 | 1/2005 | Oono et al. | |
| 2005/0180526 A1 | 8/2005 | Kim et al. | |
| 2006/0223487 A1 | 10/2006 | Alam et al. | |
| 2006/0276146 A1 | 12/2006 | Suzuki et al. | |
| 2006/0276147 A1 | 12/2006 | Suzuki et al. | |
| 2007/0259620 A1* | 11/2007 | Joet | H04B 1/0025 455/15 |
| 2008/0081573 A1 | 4/2008 | Hwang et al. | |
| 2008/0139150 A1 | 6/2008 | Li et al. | |
| 2008/0144539 A1 | 6/2008 | Sperlich et al. | |

FOREIGN PATENT DOCUMENTS

| | | |
|---|---|---|
| CN | 1832359 | 9/2006 |
| CN | 200941614 | 8/2007 |
| CN | 101227690 | 7/2008 |
| CN | 101257321 | 9/2008 |
| EP | 1032981 | 8/2004 |
| EP | 1793504 A2 | 6/2007 |
| EP | 2333968 | 6/2011 |
| GB | 2434281 | 7/2007 |
| JP | 2003-92518 | 3/2003 |
| JP | 2003-152815 | 5/2003 |
| JP | 2006-49967 | 2/2006 |
| JP | 2007-13947 | 1/2007 |
| JP | 2007-20157 | 1/2007 |
| JP | 2007-228157 | 9/2007 |
| WO | 2008/078195 | 7/2008 |
| WO | 2009/022868 | 2/2009 |
| WO | 2009/041785 | 4/2009 |
| WO | 2009/130543 | 10/2009 |

OTHER PUBLICATIONS

Extended European Search Report dated Nov. 24, 2014 in corresponding European Patent Application No. 14176872.1.
*E-UTRA Downlink Control Signalling—Overhead Assessment*, TSG-RAN WG1 #44, R1-060573, Feb. 13-17, 2006 (7 pages).
*Refinements on Signalling of CQI/Precoding Information on PDCHH*, 3GPP TSG-RAN WG1 #52bis, R1-081682, Mar. 31-Apr. 4, 2008 (4 pages).
*Semi-Persistent Scheduling and MIMO modes*, 3GPP TSG RAN WG1 Meeting #54bis, R1-083512, Sep. 29-Oct. 3, 2008 (3 pp).
U.S. Appl. No. 13/553,235, filed Jul. 19, 2012, Huang, Huawei Technologies Co., Ltd. of Shenzhen, P.R. China.
International Search Report of Corresponding PCT Application PCT/CN2011/070420 mailed Apr. 28, 2011.
International Search Report issued Apr. 28, 2011 in corresponding International Patent Application No. PCT/CN2011/070420.
Written Opinion of the International Searching Authority issued Apr. 28, 2011 in corresponding International Patent Application No. PCT/CN2011/070420.
*E-UTRA Downlink Control Signaling—Overhead Assessment*, TSG-RAN WG1 #44, R1-060573, Feb. 13-17, 2006 (7 pp.).
*PDCCH Content and Formats*, 3GPP TSG RAN WG 52bis, R1-081367, Mar. 31-Apr. 4, 2008, pp. 1-6.
*Refinements on Signalling of CQI/Precoding Information on PDCCH*, 3GPP TSG-RAN WG1 #52bis, R1-081682, Mar. 31-Apr. 4, 2008 (4 pp.).
*Semi-Persistent Scheduling and MIMO modes*, 3GPP TSG RAN WG1 Meeting #54bis, R1-083512, Sep. 29-Oct. 3, 2008 (3 pp.).
*Tx Diversity of LTE-Advanced PUSCH*, 3GPP TSG RAN WG1 Meeting #57bis, R1-092579, Jun. 29-Jul. 3, 2009 (10 pp.).
Extended European Search Report, dated Dec. 7, 2012, in corresponding European Application No. 11741918.4 (13 pp.).
Extended European Search Report, dated Dec. 11, 2012, in corresponding European Application No. 11734374.9 (10 pp.).
Restriction Requirement, dated Oct. 25, 2013, in corresponding U.S. Appl. No. 13/553,235 (6 pp.).
Office Action, dated Feb. 13, 2014, in corresponding U.S. Appl. No. 13/553,235 (27 pp.).
Japanese Office Action mailed Jul. 30, 2013 in corresponding Japanese Application No. 2012-549243.

\* cited by examiner

RECEIVER, TRANSMITTER, FEEDBACK DEVICE, TRANSCEIVER AND SIGNAL PROCESSING METHOD

CROSS-REFERENCE TO RELATED APPLICATIONS

This application is a continuation of U.S. patent application No. U.S. Ser. No. 13/553,235, now U.S. Pat. No. 8,854,989, filed on Jul. 19, 2012, which is a continuation of International Patent Application No. PCT/CN2011/070420, filed on Jan. 20, 2011, which claims priority to Chinese Patent Application No. 201010000798.1, filed on Jan. 20, 2010, all of which are hereby incorporated by reference in their entireties.

FIELD OF THE INVENTION

The present invention relates the field of communications technologies, and in particular, to a receiver, a transmitter, a transmitter feedback device, a transceiver, a method for transmitting a multi-frequency band signal, a method for receiving a multi-frequency band signal, and a method for processing a transmitter feedback signal.

BACKGROUND OF THE INVENTION

The wireless communication technology has undergone development phases from analog communication to digital communication, from single carrier (Single carrier) communication to multi-carrier (Multi-carrier) communication, from single-mode (Single-Mode) communication to multi-mode (Multi-Mode) communication. At present, a multi-frequency band (Multi-Frequency Band) communication technology becomes a next hot topic that manufacturers of communications devices and research institutes focus on.

The frequency band refers to spectrum resources distributed in certain bandwidth, and the multi-frequency band refers to a combination of two or more frequency bands separated by a certain distance at a spectrum. For example, in a UMTS (Universal Mobile Telecommunications System, universal mobile telecommunications system), a frequency band Band 1 has a downlink of 2110 MHz to 2170 MHz and an uplink of 1920 MHz to 1980 MHz. In the TD-SCDMA (Time Division-Synchronous Code Division Multiple Access, time division-synchronous code division multiple access), a frequency band A is 1880 MHz to 1900 MHz, and a frequency band B is 2010 MHz to 2025 MHz. The multi-frequency band may be a combination of frequency bands for different standards, for example, frequency bands for the UMTS and the LTE (Long Term Evolution, long term evolution); and may also be a combination of different frequency bands for the same standard, for example, the frequency band A and the frequency band B in the TD-SCDMA.

A multi-frequency band telecommunications system is also referred to as a multi-standard telecommunications system. In the multi-frequency band telecommunications system, a transceiver (Transceiver) may receive and send radio frequency signals on multiple frequency bands at the same time. A key apparatus in the multi-frequency band telecommunications system is a multi-frequency band transceiver. At present, an applied solution of the multi-frequency band transceiver is referred to as a multi-density transceiver. The multi-density transceiver directly uses multiple sets of discrete components to constitute multiple radio frequency channels to process different frequency band signals, or uses a highly integrated semiconductor process to integrate multiple radio frequency transceiver channels inside one same system in a package (System in a package, SIP) or an IC (Integrated circuit, integrated circuit). A set of signal processing channels usually includes a downlink channel, an uplink channel and a feedback channel. The downlink channel usually includes modules such as a digital part, a digital analog converter, a modulator or a mixer, an amplifier, a power amplifier, and a frequency band filter, and the uplink channel usually includes modules such as a frequency band filter, an LNA (Low Noise Amplifier, low noise amplifier), an amplifier, a mixer or a demodulator, an analog digital converter, and a digital part.

However, for the practice that multiple radio frequency transceiver channels are integrated in one same system in a package or an IC by using the highly integrated semiconductor process, there is a problem whether an isolation degree and performance of the radio frequency signal of different frequency bands can satisfy protocol requirements. When multiple sets of discrete components directly constitute multiple radio frequency channels to process different frequency band signals, the problem of the isolation degrees and the performance of different frequency bands may be solved, but the problems that the apparatus has a huge volume, high power consumption, and a high cost occur. Similarly, the multi-frequency band signal brings about higher requirements for the bandwidth supported by the feedback channel, and the problem same as that in the multi-radio frequency transceiver channel also exists in the multi-channel solution of the feedback channel.

SUMMARY OF THE INVENTION

Embodiments of the present invention provide a transmitter feedback device, a transmitter, a receiver, a transceiver, a method for processing a transmitter feedback signal, a method for transmitting a multi-frequency band signal, and a method for receiving a multi-frequency band signal, so as to reduce the volume, power consumption and cost of the apparatus for processing a multi-frequency band signal.

In one aspect, the present invention provides a transmitter feedback device, which includes: a multi-channel frequency selection band-pass circuit, configured to receive a multi-frequency band feedback signal coupled at a downlink line between a transmitter downlink radio frequency channel and an antenna, and output a feedback signal of each frequency band in the multi-frequency band feedback signal in a time-division manner, where the multi-frequency band feedback signal includes feedback signals of at least two frequency bands; a feedback local oscillator, configured to provide a feedback local oscillation corresponding to each frequency band in a time-division manner; a mixer, configured to mix the feedback signal of each frequency band from the multi-channel frequency selection band-pass circuit and the feedback local oscillation corresponding to each frequency band from the feedback local oscillator, and output an intermediate frequency signal of each frequency band in a time-division manner; and an analog digital converter, configured to perform analog digital conversion on the intermediate frequency signal of each frequency band to obtain a digital signal of each frequency band.

In another aspect, the present invention provides a transmitter including the feedback device.

In another aspect, the present invention provides a transmitter, which includes: a digital frequency shifter, configured to perform, on baseband I digital signals and baseband Q digital signals of multiple frequency bands, digital frequency shift to a frequency corresponding to each frequency band, respectively, where the multiple frequency bands include at least two frequency bands; a combiner, configured to combine the I digital signals and the Q digital signals of multiple frequency bands, which are after digital modulation, into a multi-frequency band combined I digital signal and a multi-frequency band combined Q digital signal, respectively; a first digital analog converter and a second digital analog converter, configured to convert the multi-frequency band combined I digital signal and the multi-frequency band combined Q digital signal into a multi-frequency band combined I analog signal and a multi-frequency band combined Q analog signal, respectively; a first reconstruction filter and a second reconstruction filter, configured to filter the multi-frequency band combined I analog signal and the multi-frequency band combined Q analog signal, respectively; a downlink local oscillator, configured to provide local oscillation; a quadrature modulator, configured to modulate the multi-frequency band combined I analog signal and the multi-frequency band combined Q analog signal into a radio frequency signal of multi-frequency bands by using the local oscillation provided by the downlink local oscillator; and an amplifier, configured to amplify the radio frequency signal of multi-frequency bands.

In another aspect, the present invention provides a receiver, which includes: an amplification device, configured to amplify a received radio frequency signal of multi-frequency bands, where the multi-frequency bands include at least two frequency bands; an uplink local oscillator, configured to provide local oscillation; a quadrature demodulator, configured to turn the local oscillation provided by the uplink local oscillation oscillator into two quadrature carriers, mix the radio frequency signal of multi-frequency bands and two quadrature carriers received from the amplification device, respectively, and output a multi-frequency band I analog signal and a multi-frequency band Q analog signal; a first anti-aliasing filter and second anti-aliasing filter, configured to perform anti-aliasing filtering on the multi-frequency band I analog signal and the multi-frequency band Q analog signal, respectively; a first analog digital converter and a second analog digital converter, configured to convert the multi-frequency band I analog signal and the multi-frequency band Q analog signal, which are after anti-aliasing filtering, into a multi-frequency band I digital signal and a multi-frequency band Q digital signal, respectively; a channel separation device, configured to separate an I digital signal and a Q digital signal corresponding to each frequency band from the multi-frequency band I digital signal and the multi-frequency band Q digital signal, respectively; and a digital frequency shifter, configured to perform, on the I digital signal and the Q digital signal of each frequency band, digital frequency shift into baseband signals.

In another aspect, the present invention provides a transceiver including the transmitter, the receiver and the feedback device.

In another aspect, the present provides a method for processing a transmitter feedback signal, which includes: outputting, in a time-division manner, a feedback signal of each frequency band in a multi-frequency band feedback signal coupled at a downlink line between a transmitter downlink radio frequency channel and an antenna, where each frequency band includes at least two frequency bands; generating a feedback local oscillation corresponding to each frequency band in a time-division manner; mixing the feedback signal of each frequency band output in a time-division manner and the feedback local oscillation corresponding to each frequency band, and outputting an intermediate frequency signal of each frequency band; and performing analog digital conversion on the intermediate frequency signal of each frequency band to generate a digital signal of each frequency band.

In another aspect, the present provides a method for transmitting a multi-frequency band signal, which includes: performing, on baseband I digital signals and baseband Q digital signals of multiple frequency bands, digital frequency shift to a frequency corresponding to each frequency band, respectively, where the multiple frequency bands include at least two frequency bands; combining a I digital signals and Q digital signals of multiple frequency bands respectively to obtain a multi-frequency band combined I digital signal and a multi-frequency band combined Q digital signal; converting the multi-frequency band combined I digital signal and the multi-frequency band combined Q digital signal into a radio frequency analog signal of multi-frequency bands; and transmitting the radio frequency analog signal of multi-frequency bands through a multi-frequency band antenna.

In another aspect, the present provides a method for receiving a multi-frequency band signal, which includes: demodulating a received radio frequency signal of multi-frequency bands with a quadrature demodulator to obtain a multi-frequency band I analog signal and a multi-frequency band Q analog signal, where the multi-frequency bands include at least two frequency bands; performing analog digital conversion on the multi-frequency band I analog signal and the multi-frequency band Q analog signal to obtain a multi-frequency band I digital signal and a multi-frequency band Q digital signal; performing channel separation on the multi-frequency band I digital signal and the multi-frequency band Q digital signal to obtain an I digital signal and a Q digital signal of each frequency band; and obtaining a baseband I digital signal and a baseband Q digital signal of each frequency band according to the I digital signal the Q digital signal of each frequency band.

With the transmitter, the receiver, the transceiver, the transmitter feedback device, the signal transmitting method, the signal receiving method, the feedback signal processing method of the present invention, a set of downlink radio frequency channels, uplink radio frequency channels or feedback radio frequency channels may be adopted to receive a multi-frequency band signal, transmit a multi-frequency band signal or process a feedback multi-frequency band signal, so as to reduce a volume and the power consumption of the apparatus for processing a multi-frequency band signal, and decrease the cost.

BRIEF DESCRIPTION OF THE DRAWINGS

To illustrate the technical solutions according to the embodiments of the present invention or in the prior art more clearly, the accompanying drawings needed for describing the embodiments or the prior art are introduced below briefly. Apparently, the accompanying drawings in the following descriptions merely show some of the embodiments of the present invention, and persons skilled in the art may obtain other drawings according to the accompanying drawings without creative efforts.

DETAILED DESCRIPTION OF THE EMBODIMENTS

Figure 1:
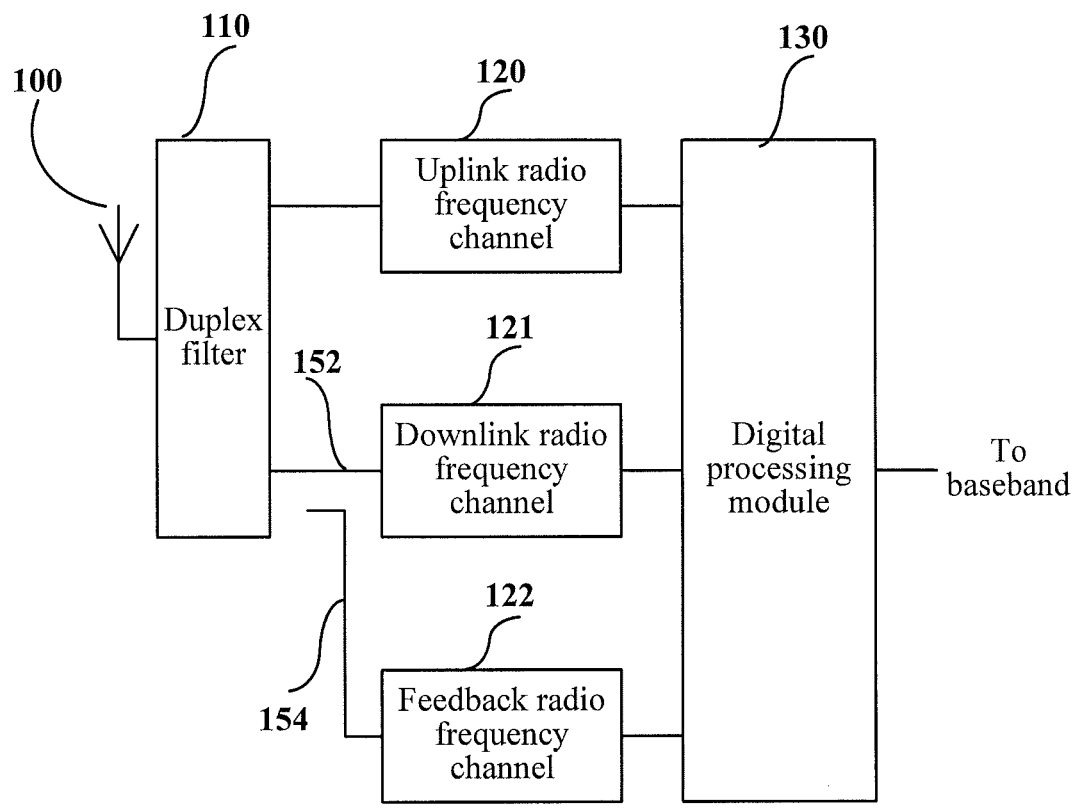
FIG. 1 is a block diagram of a multi-frequency band transceiver according to an embodiment of the present invention.

The present invention is described in all rounds with reference to the accompanying drawings. In the accompanying drawings, a same mark represents a same or similar component or a same or similar element.

In the embodiments in the following, the following English abbreviations have the following meaning, DAC refers to a digital analog converter (Digital Analog Converter, DAC), ADC refers to an analog digital converter (Analog Digital Converter, ADC), SAW refers to a surface acoustic wave (Surface Acoustic Wave), and DPD refers to digital pre-distortion (Digital Pre-Distortion).

In this embodiment, a multi-frequency band signal refers to a signal including two or more frequency bands; a central frequency of multiple (pieces of) frequency bands refers to an intermediate value between a highest frequency and a lowest frequency in all the frequency bands; and the central frequency of each frequency band refers to the intermediate value between the highest frequency and the lowest frequency of each frequency band.

For example, the multi-frequency band signal includes 3 frequency bands: a frequency band 1 (2100, 2120), a frequency band 2 (2000, 2020), and a frequency band 3 (1700, 1720), the central frequency of each frequency band is: the frequency band 1 (2110), the frequency band 2 (2010), and the frequency band 3 (1710), respectively; and the central frequency of the multiple (pieces of) frequency bands is an intermediate value between the highest frequency and the lowest frequency in all the frequency bands, (1700+2120)/2=1910.

In the case of the DPD (Digital Pre-Distortion, digital pre-distortion), it is assumed that the DPD needs 3 orders, and the bandwidth that the 3 frequency bands need are respectively: a frequency band 1 (2080, 2140), a frequency band 2 (1980, 2040), and a frequency band 3 (1680, 1740). At this time, the central frequency of the multiple frequency bands is the intermediate value between the highest frequency and the lowest frequency in all the frequency bands, which is equal to (2140+1680)/2=1910.

FIG. 1 is a block diagram of a multi-frequency band transceiver according to an embodiment of the present invention. As shown in FIG. 1, the multi-frequency band transceiver may include an antenna 100, a duplex filter (Duplexer) 110, an uplink radio frequency channel (Uplink RF) 120, a downlink radio frequency channel (Downlink RF) 121, a feedback radio frequency channel (Feedback RF) 122, and a digital processing module (Digital Block) 130. The antenna 100 is an antenna unit capable of transceiving a multi-frequency band signal, or a combination of multiple antenna units transceiving different frequency band signals. The duplex filter 110 may perform transceiving bidirectional passband passing and stopband suppression, which are needed for satisfying a protocol index, on a supported multiple frequency band. The uplink radio frequency channel 120 is mainly configured to receive the multi-frequency band uplink signal from the duplex filter 110, and send the received multi-frequency band uplink signal, which is turned into a digital signal sequence after amplification, spectrum shifting and sample quantization, to the digital processing module 130. The downlink radio frequency channel 121 is mainly configured to turn the multi-frequency band digital signal provided by the digital processing module 130 into a multi-frequency band analog signal, and transmit, through the duplex filter 11, the multi-frequency band analog signal after spectrum shifting and amplification. The function of the feedback radio frequency channel 122 is to perform, through a feedback line 154, coupling and power amplification on at least one of a non-linear distortion signal at a downlink line 152, an IQ amplitude and imbalanced phase of quadrature modulation in the downlink radio frequency channel 121, and a local oscillation leakage signal, and send the signal to the digital processing module 130, in which the signal is turned into a digital signal sequence after spectrum shifting and analog digital conversion.

Functions completed by the digital processing module may include:

performing rate conversion channel processing and pre-distortion on digital baseband downlink signals of multiple frequency bands to provide a high-speed multi-frequency band digital signal for the downlink radio frequency channel 121;

controlling a switch at a feedback radio frequency channel to perform switching of each frequency band;

obtaining non-linear data of the downlink radio frequency channel from the feedback radio frequency channel 122 and performing operation to obtain a pre-distortion table and analog quadrature modulation distortion calibration information; and performing, on a high-speed uplink multi-frequency band digital signal obtained by the uplink radio frequency channel 120, channel separation, quadrature error calibration, and digital down-conversion into a baseband digital signal of each frequency band to provide the baseband digital signal for the baseband.

It should be noted that, a multi-frequency band transceiver in FIG. 1 shows the uplink radio frequency channel 120, the downlink radio frequency channel 121 and the feedback radio frequency channel 122. Persons skilled in the art should understand that, the device provided by the embodiment of the present invention may include one or more of the uplink radio frequency channel 120, the downlink radio frequency channel 121, and the feedback radio frequency channel 122. Correspondingly, the digital processing module 130 includes one or more of the foregoing functions.

According to an embodiment of the present invention, carrier configuration adopts a digital domain positive and negative frequency configuration manner. That is, a local oscillation frequency of quadrature modulation/demodulation is configured at a central frequency of the multiple frequency bands. In a digital domain, two frequency bands separated by a longest distance need to be configured at two sides, and other frequency bands are configured in the middle, and the frequency of a digital control oscillator for digital frequency shift of each frequency band is an intermediate frequency of each frequency band minus an oscillation frequency. The embodiment of the present invention may adopt a double side AQM (Analog Quadrature Modulator, analog quadrature modulator) bandwidth system, which increases the bandwidth twice as much as that of the system adopting a single-side AQM in the prior art.

For example, as a specific example of the foregoing embodiment, for a signal of two frequency bands, the characteristic of a downlink digital signal generated by a digital processing module through controlling the frequency of the digital control oscillator is that the signal of two frequency bands including two parts, located in a positive area and a negative area of a complex frequency domain, respectively. For example, the central frequency of a frequency band 1 is 50 MHz, and the central frequency of a frequency band 2 is −50 MHz. Because the frequency of the digital control oscillator for digital frequency shift of each frequency band is the intermediate frequency of each frequency band minus the local oscillation frequency, in this way, the local oscillation of the downlink radio frequency channel is located in the middle of two frequency bands that are obtained after the two frequency bands are mixed with the local oscillation, respectively. Similarly, the local oscillation of the uplink radio frequency channel is located in the middle of the two frequency bands that are obtained after the two frequency bands are mixed with the local oscillation, respectively. If the system is a TDD system, one same oscillator may be shared to transceive the local oscillation. The digital processing module performs quadrature error calibration on an uplink received signal so that mirrors of the signals of two frequency bands do not interfere with each other.

Figure 2:
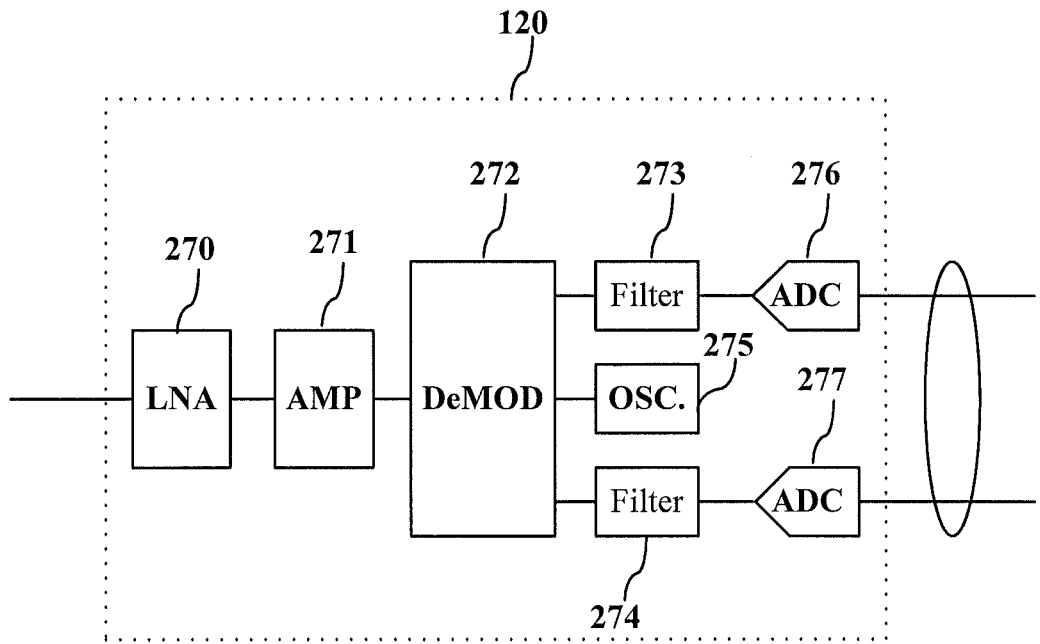
FIG. 2 is a block diagram of an uplink radio frequency channel according to an embodiment in FIG. 1.

FIG. 2 is a block diagram of an uplink radio frequency channel 120 in the embodiment corresponding to FIG. 1 according to an embodiment. As shown in FIG. 2, an uplink radio frequency channel amplifies, by using an amplification device (for example, a low-noise amplifier (LNA) 270 and an amplifier (AMP) 271), a radio frequency signal of multi-frequency bands passing through a duplex filter 110 and then sends the amplified signal to a quadrature demodulator (DeMOD) 272. The quadrature demodulator 272 converts local oscillation provided by a local oscillator (OSC.) 275 into two quadrature carriers of cos and sin, so that the multi-frequency band signal from the amplifier 271 are mixed with two quadrature carriers respectively, and then a multi-frequency band I analog signal and a multi-frequency band Q analog signal are output to a first anti-aliasing filter 273 and a second anti-aliasing filter 274, respectively. The two multi-frequency band I, Q analog signals are filtered by the first anti-aliasing filter 273 and the second anti-aliasing filter 274, respectively, are then sent to an analog digital converter 276 and an analog digital converter 277 respectively so as to be converted into a multi-frequency band I digital signal and a multi-frequency band Q digital signal, and are subsequently sent to the digital processing module 130. In different telecommunications systems, the amplification device may be different. For example, the amplification device may be a two-level low-noise amplifier, or a SAW filter and a controllable attenuator may be added after one level, and so on.

It should be understood that, in the embodiment of the present invention, "the multi-frequency band signal from the amplifier 271 are mixed with two quadrature carriers respectively, and then the multi-frequency band I analog signal and the multi-frequency band Q analog signal are output to the first anti-aliasing filter 273 and the second anti-aliasing filter 274, respectively" may specifically be, the multi-frequency band signal from the amplifier 271 is mixed with the two quadrature carriers, respectively, and then the multi-frequency band I analog signal is output to the first anti-aliasing filter 273 and the multi-frequency band Q analog signal is output to the second anti-aliasing filter 274.

Figure 3:
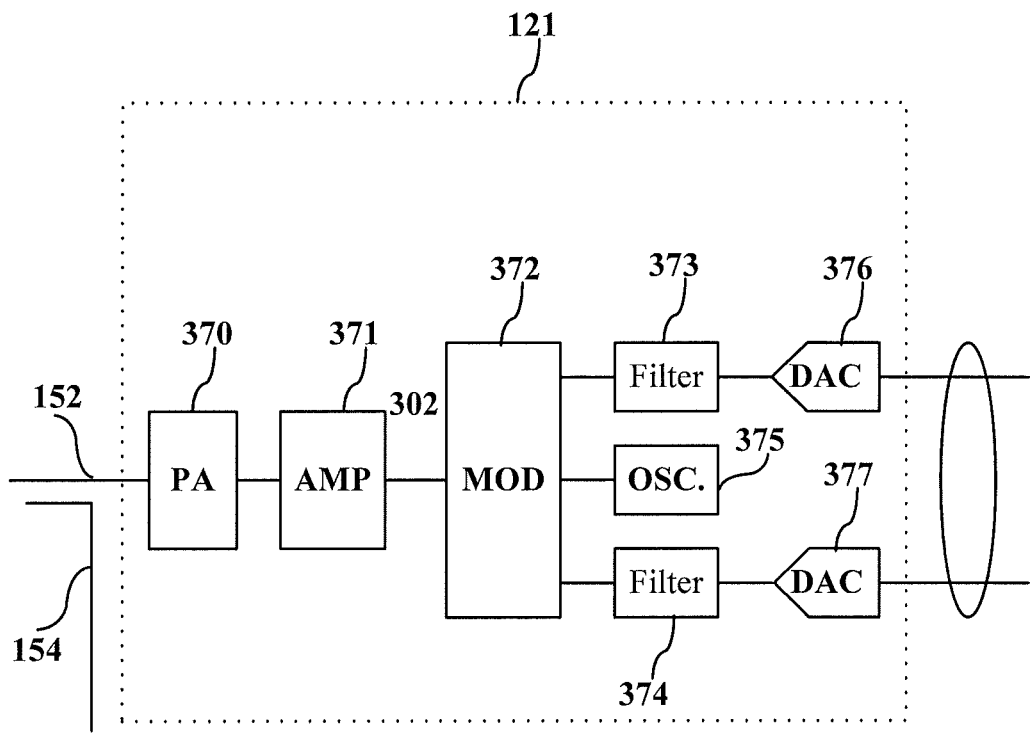
FIG. 3 is a block diagram of a downlink radio frequency channel according to an embodiment in FIG. 1.

FIG. 3 is a block diagram of a downlink radio frequency channel 121 in FIG. 1 according to an embodiment. As shown in FIG. 3, after a DAC 376 and a DAC 377 perform digital analog conversion on the multi-frequency band combined I digital signal and the multi-frequency band combined Q digital signal, which are sent by the digital processing module 130, respectively, a multi-frequency band combined I analog signal and a multi-frequency band combined Q analog signal are obtained. The multi-frequency band combined I analog signal and the multi-frequency band combined Q analog signal are sent to a first reconstruction filter 373 and a second reconstruction filter 374 for filtering, respectively, and then are sent to a quadrature modulator (MOD) 372 respectively to be modulated by the quadrature modulator 372 into a radio frequency signal of multi-frequency bands, which are sent to an amplifier 371 and a power amplifier 370 for amplification, and are subsequently transmitted through the antenna. The quadrature modulator 372 is connected to the local oscillator (OSC.) 375, and the local oscillator 375 provides local oscillation for the quadrature modulator 372.

According to an embodiment of the present invention, the bandwidth supported by each component (including the DAC, the quadrature modulator, the amplifier, and the power amplifier) in the downlink radio frequency channel is a sum of the multi-frequency band bandwidth satisfying the demand and the bandwidth that the digital pre-distortion of multiple frequency bands need, and the bandwidth supported by each component (including the ADC, the demodulator, and the amplifier) in the uplink radio frequency channel is the sum of the multi-frequency band bandwidth satisfying the requirements and the bandwidth that the digital pre-distortion of multiple frequency bands need.

Figure 4:
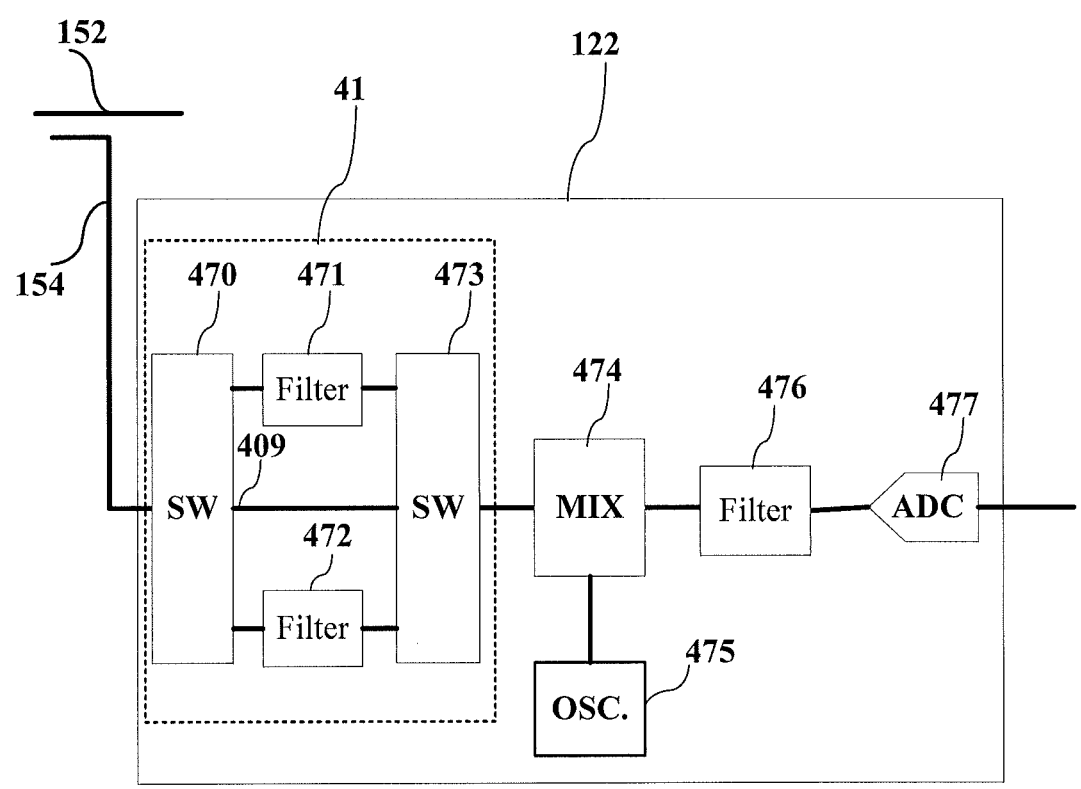
FIG. 4 is a block diagram of a feedback radio frequency channel according to an embodiment in FIG. 1.

FIG. 4 is a block diagram of a feedback radio frequency channel 122 in FIG. 1 according to an embodiment. As shown in FIG. 4, in the feedback radio frequency channel 122, a feedback line 154 couples a part of signals from a downlink line 152, where a coupler usually is attenuation of dozens of dBs, and the signal is sent to a multi-channel frequency selection band-pass circuit 41 through the feedback line 154. The multi-channel frequency selection band-pass circuit 41 is configured to output the received feedback signal of each frequency band in the multi-frequency band feedback signal in a time-division manner. A feedback local oscillator (OSC.) 475 is configured to provide feedback local oscillation corresponding to each frequency band for a mixer 474 in a time-division manner. The feedback signal output by the multi-channel frequency selection band-pass circuit 41 is sent to the mixer 474 to be mixed with the feedback local oscillation, and then an intermediate frequency signal of each frequency band is obtained. The intermediate frequency signal of each frequency band output by the mixer 474 in a time-division manner passes through an anti-aliasing filter 476 and is then sent to an ADC 477 for sample quantization to a digital signal sequence which is then sent to the digital processing module 130.

According to an embodiment of the present invention, the multi-channel frequency selection band-pass circuit 41 includes a single-pole multi-throw switch (SW) 470, a second single-pole multi-throw switch (SW) 473, a first frequency band filter 471, and a second frequency band filter 472. In the embodiment of the multi-channel frequency selection band-pass circuit formed of the first single-pole multi-throw switch 470, the second single-pole multi-throw switch 473, the first frequency band filter 471, and the second frequency band filter 472, by controlling the first single-pole multi-throw switch 470 and the second single-pole multi-throw switch 473 at the same time, the signal is able to pass through the first frequency band filter 471 or the second frequency band filter 472 at a different time slot, or pass through a direct channel 409 so that the signal is capable of passing through directly. The bandwidth of the first frequency band filter 471 and the second frequency band filter 472 may be the bandwidth of the frequency band, which needs to be passed through, multiplied by a pre-distortion order (for example, 3 or 5) that the DPD needs.

As an example, the multi-channel frequency selection band-pass circuit 41 shown in FIG. 4 includes two filters: the first frequency band filter 471 and the second frequency band filter 472. Persons skilled in the art should understand that, in different embodiments, the number of the filers included in the multi-channel frequency selection band-pass circuit 41 may be the same as the number of supported frequency bands.

The feedback signals of multiple frequency bands bring about a high requirement for the bandwidth of the ADC in the feedback channel, and the feedback ADC usually cannot support such a large bandwidth. In the feedback channel in the present invention, the feedback signal of each frequency band in the multi-frequency band feedback signal coupled at a transmitter is output in a time-division manner by using the multi-channel frequency selection band-pass circuit, the feedback local oscillator is controlled to generate the corresponding local oscillation in a time-division manner at the same time, so that the intermediate frequency signal, which is obtained after a gated frequency band and the feedback local oscillation are mixed, is in the anti-aliasing filter of the feedback ADC, and the feedback ADC collects the feedback signal. Therefore, the problem that the bandwidth of the multi-frequency band feedback signal is too large is solved, and compared with an existing solution that multiple feedback radio frequency channels are adopted to process the feedback signal of each frequency band respectively, improved beneficial effects are produced in the aspects such as the volume, power consumption, and cost of the apparatus.

Figure 5:
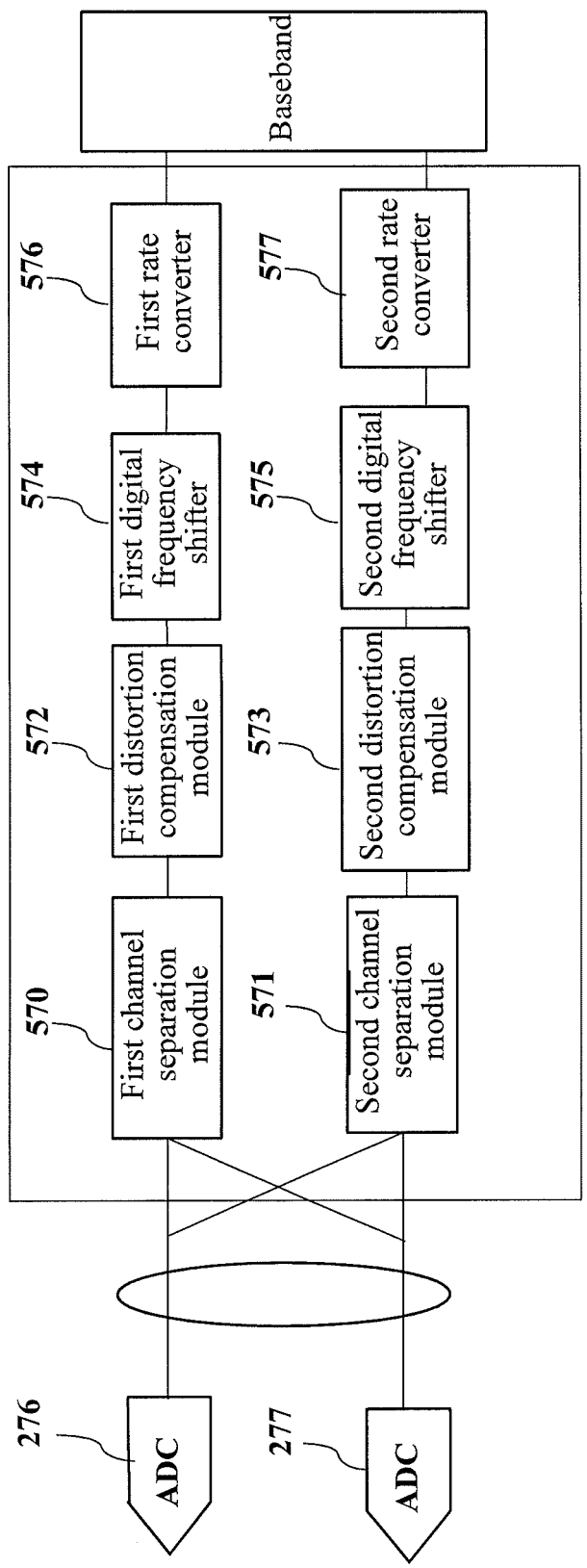
FIG. 5 is a block diagram of an uplink signal digital processing part of a digital processing module according to an embodiment of the present invention.

FIG. 5 is a block diagram of an uplink signal digital processing part of a digital processing module 130 according to an embodiment of the present invention. As shown in FIG. 5, the uplink signal digital processing part includes a first channel separation module 570, a second channel separation module 571, a first distortion compensation module 572, a second distortion compensation module 573, a first digital frequency shifter 574, a second digital frequency shifter 575, a first rate converter 576, and a second rate converter 577. The first channel separation module 570 and the second channel separation module 571 receive a multi-frequency band I digital signal and a multi-frequency band Q digital signal respectively, which are obtained after analog digital conversion, separate a single-frequency band I digital signal and a single-frequency band Q digital signal from the multi-frequency band I digital signal and the multi-frequency band Q digital signal respectively. Distortion compensation on the single-frequency band I digital signal and the single-frequency band Q digital signal is performed through a first distortion compensation module 572 and a second distortion compensation module 573 respectively, and the signals are turned into baseband digital signals through a first digital frequency shifter 574, a second digital frequency shifter 575, a first rate converter 576, and a second rate converter 577, respectively.

According to an embodiment of the present invention, an uplink local oscillation frequency provided by an uplink local oscillator for a quadrature demodulator is a central frequency of supported multi-frequency bands, so that an intermediate frequency signal after passing through a quadrature demodulator has an upper sideband and a lower sideband symmetrical that are relative to a zero frequency.

It should be understood that, in the embodiment of the present invention, the distortion compensation module or the rate conversion module may not be included.

For the receiver provided by the present invention, a single uplink radio frequency channel processes a received radio frequency signal of multi-frequency bands, and a digital processing module performs channel separation on a multi-frequency band digital signal and converts the signal into the baseband digital signal of each frequency band, which therefore solves the problem that the cost, volume, and power consumption increase significantly as a multi-density telecommunications system supports the multiple frequency bands, and the problem that the isolation degree and performance of radio frequency signals of different frequency bands cannot satisfy a protocol demand because multiple radio frequency transceiver channels are integrated in one same system in a package or an IC. In addition, a double-sideband AQM solution may be adopted, and compared with a single-sideband AQM solution, supported bandwidth expands twice as large, and the bandwidth problem of the single-uplink radio frequency channel is solved.

Figure 6:
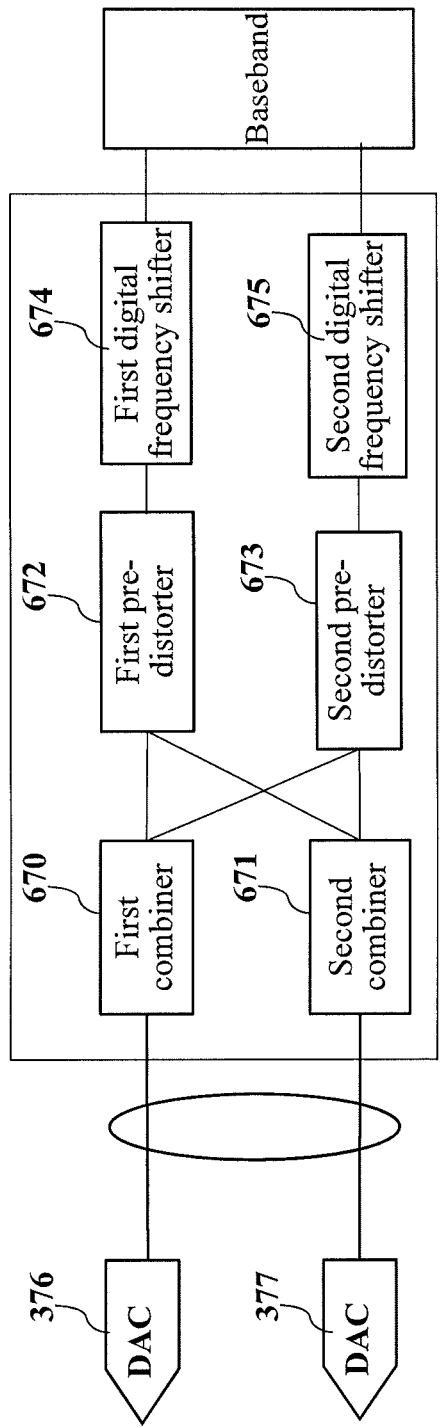
FIG. 6 is a block diagram of a downlink signal digital processing part of a digital processing module according to an embodiment of the present invention.

FIG. 6 is a block diagram of a downlink signal digital processing part of a digital processing module 130 according to an embodiment of the present invention. As shown in FIG. 6, the downlink signal digital processing part includes a first combiner 670, a second combiner 671, a first pre-distorter 672, a second pre-distorter 673, a first digital frequency shifter 674, and a second digital frequency shifter 675. The first digital frequency shifter 674 and the second digital frequency shifter 675 are configured to modulate a baseband digital signal of a single-frequency band to a frequency corresponding to each frequency band through further shift of modulation and spectrum, respectively. The first pre-distorter 672 and the second pre-distorter 673 are configured to perform pre-distortion processing on a frequency shifted single-frequency band intermediate frequency digital signal. The first combiner 670 and the second combiner 671 are configured to combine an I digital signal in each single-frequency band digital signal and combine a Q digital signal in each single-frequency band digital signal, respectively, so as to generate a multi-frequency band combined I digital signal and a multi-frequency band combined Q digital signal, which are then sent to a downlink radio frequency channel. The downlink radio frequency channel converts the multi-frequency band combined I digital signal and the multi-frequency band combined Q digital signal into a radio frequency signal of multi-frequency bands for transmission.

It should be understood that, in the embodiment of the present invention, the pre-distorter may also not be included.

According to an embodiment of the present invention, a digital frequency shifter of the transmitter performs, on the signal of each frequency band, frequency shift to a frequency which is the frequency of this frequency band minus the frequency of downlink local oscillation, where the frequency of the downlink local oscillation is set as a central frequency of multiple frequency bands. In this way, the intermediate frequency signal after passing a digital frequency shifter has an upper sideband and a lower sideband symmetrical, which are relative to a zero frequency.

For the transmitter provided in the present invention, a multi-frequency band analog signal is processed through a single-downlink radio frequency channel, which therefore solves the problem that the cost, volume, and power consumption increase significantly as a multi-density telecommunications system supports multiple frequency bands, and the problem that the isolation degree and performance of the radio frequency signals of different frequency bands cannot satisfy a protocol demand because multiple radio frequency transceiver channels are integrated in one same system in a package or an IC. In addition, a double-sideband AQM solution may be adopted, and compared with a single-sideband AQM solution, the supported bandwidth expands twice as large, and the bandwidth problem of the single-downlink radio frequency channel is solved.

It should be noted that, each component in the digital processing module shown in FIG. 5 and FIG. 6 may be implemented through software, hardware, or a combination of software and hardware. As an example, FIG. 5 and FIG. 6 only show processing of signals of two frequency bands, and persons skilled in the art may easily extend the foregoing structure to processing of signals including three or more frequency bands according to the instruction of the present invention. In FIG. 5 and FIG. 6, corresponding to two frequency bands, each component includes two corresponding units (for example, the first combiner 670, the second combiner 671, the first pre-distorter 672, the second pre-distorter 673, the first digital frequency shifter 674, and the second digital frequency shifter 675), and it should be understood by persons skilled in the art that each component may also include only one unit to process the digital signal of each frequency band in turns.

Figure 7:
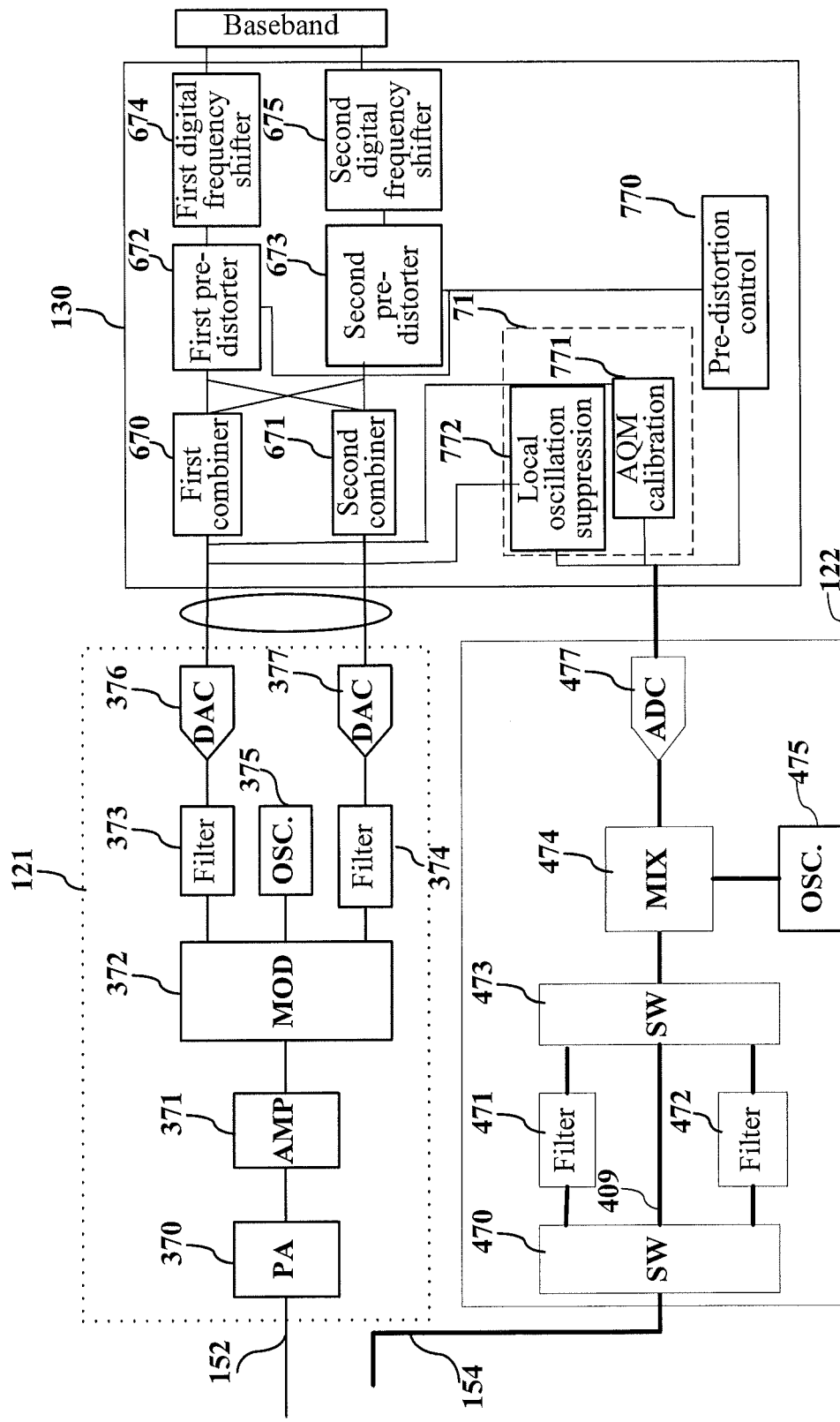
FIG. 7 is a block diagram of a transmitter including a feedback device according to an embodiment of the present invention.

FIG. 7 is a block diagram of a transmitter including a feedback device according to an embodiment of the present invention. For a downlink radio frequency channel 121 and a feedback radio frequency channel 122 of the transmitter in FIG. 7, reference may be made to the description of corresponding FIG. 3 and FIG. 4, and for a downlink signal processing part of a digital processing module 130, reference may be made to the description of corresponding FIG. 6, which are no longer described in detail here for simplicity. The digital processing part of the feedback device of the transmitter and the correlation between the digital processing part of the feedback device of the transmitter and the downlink signal processing module are described in detail in the following. As shown in FIG. 7, the digital processing module 130 further includes a pre-distortion control unit 770. A pre-distortion control unit 770 receives a digital feedback signal of each frequency band output from an analog digital converter 477, performs DPD operation in a time-division manner on data of each frequency band sampled in a time-division manner, respectively, and obtains the pre-distortion correction signal corresponding to each frequency band to compensate for the gains of an I digital signal and a Q digital signal of a corresponding frequency band. A pre-distortion correction signal corresponding to each frequency band may be stored in a pre-distortion table of each frequency band, the pre-distorter 672 and the pre-distorter 673 may perform pre-distortion processing according to the content in the pre-distortion table, and outputs the digital signal of each frequency band after pre-distortion processing.

According to an embodiment of the present invention, the digital processing module 130 further includes an error acquisition unit 71, configured to receive the digital signal of each frequency band output by the analog digital converter, and extract an error correction signal according to the digital signal of each frequency band to compensate for an I digital signal and a Q digital signal that are output by the transmitter. It should be understood that, if a digital processing module 130 includes a pre-distorter, the error correction signal obtained by the error acquisition unit 71 may further be used for compensating for the I digital signal and the Q digital signal that are output by the pre-distorter of the transmitter. The error correction signal may include at least one of the following signals: a phase correction signal, used for compensating for phases of the I digital signals and the Q digital signals of multiple frequency bands; and a first and second DC (Direct Current, direct current) offset signal, used for correcting DC offsets of the I digital signals and the Q digital signals of multiple frequency bands.

According to an embodiment of the present invention, the error acquisition unit 71 may include an AQM calibration unit 771. The AQM calibration unit 771 receives digital feedback signals of two frequency bands of an upper sideband and a lower sideband of downlink local oscillation, where the digital feedback signals are output by an analog digital converter 477, collect statistics on the correlation on data feedback signals of the upper sideband and data feedback signals of the lower sideband that are collected in a time-division manner, so that the correlation is made 0 to obtain a phase correction signal. The obtained phase correction signal is acted on I, Q combined signals output by a combiner 670 and a combiner 671, and the AQM calibration is completed.

According to an embodiment of the present invention, the error acquisition unit 71 may further include a local oscillation suppression unit 772. The multi-channel frequency selection band-pass circuit 41 further includes a direct channel 409, and controls the feedback signal by a switch 470 and a switch 473, so that the feedback signal passes through the direct channel 409. The direct feedback signal passes through the mixer and is mixed to the frequency of fs/4 (fs is a sampling frequency of a feedback ADC) of a feedback ADC 477, and is converted into a direct digital signal through the analog digital converter 477. A local oscillation suppression unit 772 receives a direct data signal output from a feedback analog digital converter (ADC) 477, performs quadrature demodulation in a digital domain to obtain leakage information of the downlink local oscillation, that is, a first DC offset signal and a second DC offset signal, and adjusts a DC offset of the downlink data so that the local oscillation is suppressed.

Persons skilled in the art should understand that, the error acquisition unit 71 may include at least one of an AQM calibration unit 771 and a local oscillation suppression unit 772.

Persons skilled in the art should understand that, the pre-distortion control unit of the present invention may obtain a pre-distortion table of each frequency band by using multiple pre-distortion processing algorithms in the prior art, which is not described here again for simplicity and is not limited. The AQM calibration unit and the local oscillation suppression unit may also implement the function thereof by using a relevant algorithm in the prior art.

According to an embodiment of the present invention, the feedback device may further be a synchronous control module, configured to synchronize operations of the multi-channel frequency selection band-pass circuit and the feedback local oscillator, so that the feedback local oscillator generates, at the same time slot, the feedback local oscillation corresponding to the frequency band of the feedback signal output by the multi-channel frequency selection band-pass circuit at the time slot.

Persons skilled in the art should understand that, the transceiver according to the embodiment of the present invention may include the transmitter feedback device provided by the present invention, and/or the transmitter provided by the present invention, and/or the receiver provided by the present invention.

Figure 8:
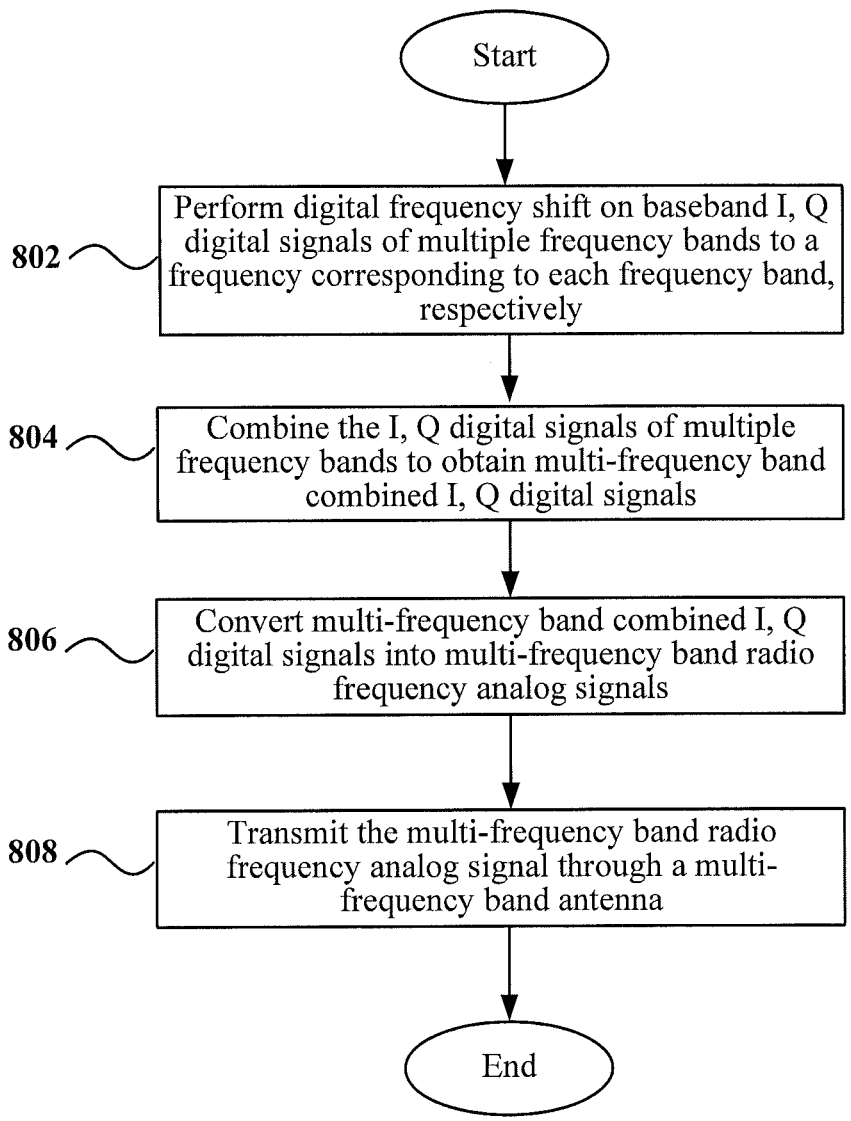
FIG. 8 is a flow chart of a method for transmitting a multi-frequency band signal according to an embodiment of the present invention.

FIG. 8 is a flow chart of a method for transmitting a multi-frequency band signal of an embodiment of the present invention. Perform, on baseband I, Q digital signals of multiple frequency bands, digital frequency shift to a frequency corresponding to each frequency band, respectively As shown in FIG. 8, in step 802, channel processing such as rate conversion is performed on baseband I digital signals and baseband Q digital signals of multiple frequency bands, respectively, and then digital frequency shift is performed on the signals to a frequency corresponding to each frequency band, respectively. The frequency of each frequency band may be modulated to a frequency, which is the frequency of the corresponding frequency band minus a downlink local oscillation frequency, respectively. The downlink local oscillation frequency may be configured as a central frequency of multiple frequency bands. A signal of two frequency bands may be configured in a mirrored manner in a digital domain by using a zero frequency as a center. For example, the sampling rates of baseband I, Q digital signals (AI,AQ), (BI,BQ), and (CI,CQ), . . . , of multiple frequency bands A, B, and C, . . . , may be improved to obtain digital signals (A1I,A1Q), (B1I,B1Q), and (C1I,C1Q), . . . ; (A1I, A1Q), (B1I,B1Q), and (C1I,C1Q), . . . , are modulated to the frequency corresponding to each frequency band (each frequency band minus the local oscillation) respectively to obtain (A2I,A2Q), (B2I,B2Q), and (C2I,C2Q), . . . .

In step 804, the I, Q digital signals of each frequency band are combined respectively to obtain a multi-frequency band combined I digital signal and a multi-frequency band combined Q digital signal; where the multi-frequency band combined I, Q digital signals may be multi-frequency band intermediate frequency combined I, Q digital signals. For example, all I paths of (A2I,A2Q), (B2I,B2Q), and (C2I, C2Q), . . . , are combined, and all Q paths of (A2I,A2Q), (B2I,B2Q), and (C2I,C2Q), . . . , are combined, so that a multi-frequency band combined I digital signal Iout and a multi-frequency band combined Q digital signal Qout are obtained. It should be understood that, specifically, I digital signals of each frequency band may be combined to obtain the multi-frequency band combined I digital signal, and Q digital signals of each frequency band may be combined to obtain the multi-frequency band combined Q digital signal.

In step 806, for example, multi-frequency band combined I, Q digital signals are converted into a radio frequency analog signal of multi-frequency bands, i.e. a multi-frequency band radio frequency analog signal, through a single-downlink radio frequency channel. In a downlink radio frequency channel, the downlink local oscillation is generated by using the downlink local oscillator, and the modulator modulates the multi-frequency band combined I, Q digital signals to a radio frequency analog signal of multi-frequency bands including the frequency bands.

In step 808, the radio frequency analog signal of multi-frequency bands is transmitted through a multi-frequency band antenna. The multi-frequency band antenna may be an antenna unit transmitting a signal of multiple frequency bands, or a combination of multiple antenna units that transceive signals of different frequency bands, respectively.

Figure 9:
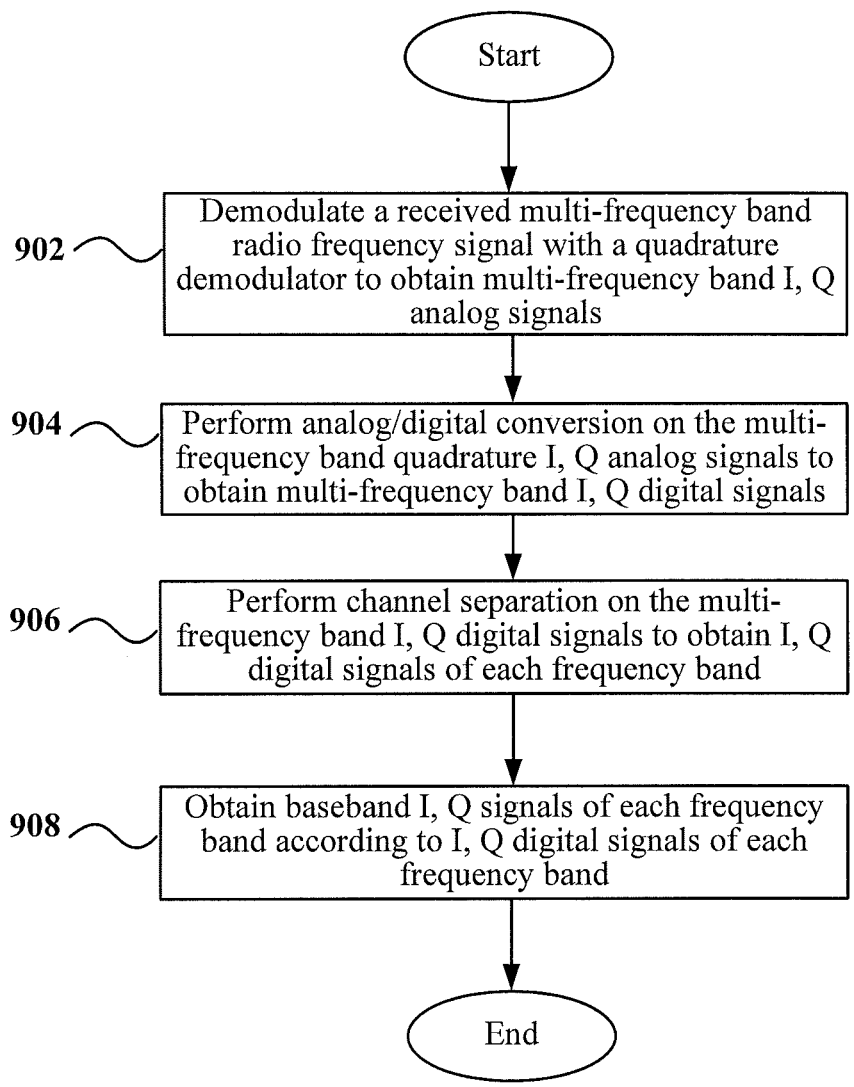
FIG. 9 is a flow chart of a method for receiving a multi-frequency band signal according to an embodiment of the present invention.

FIG. 9 is a flow chart of a method for receiving a multi-frequency band signal according to an embodiment of the present invention.

As shown in FIG. 9, in step 902, a quadrature demodulator demodulates a received radio frequency signal of multi-frequency bands to obtain multi-frequency band I, Q analog signals.

In step 904, analog digital conversion is performed on the multi-frequency band I, Q analog signals to obtain multi-frequency band I, Q digital signals.

In step 906, channel separation is performed on the multi-frequency band I, Q digital signals to obtain I, Q digital signals of each frequency band.

In step 908, baseband I, Q signals of each frequency band are obtained according to baseband I, Q digital signals of each frequency band. The digital frequency shift is performed on the separated I, Q digital signals of each frequency band to the baseband, and the processing of, such as reducing a sampling rate after frequency selection by a digital filter is performed, so that baseband I, Q digital signals of each frequency band are obtained.

Figure 10:
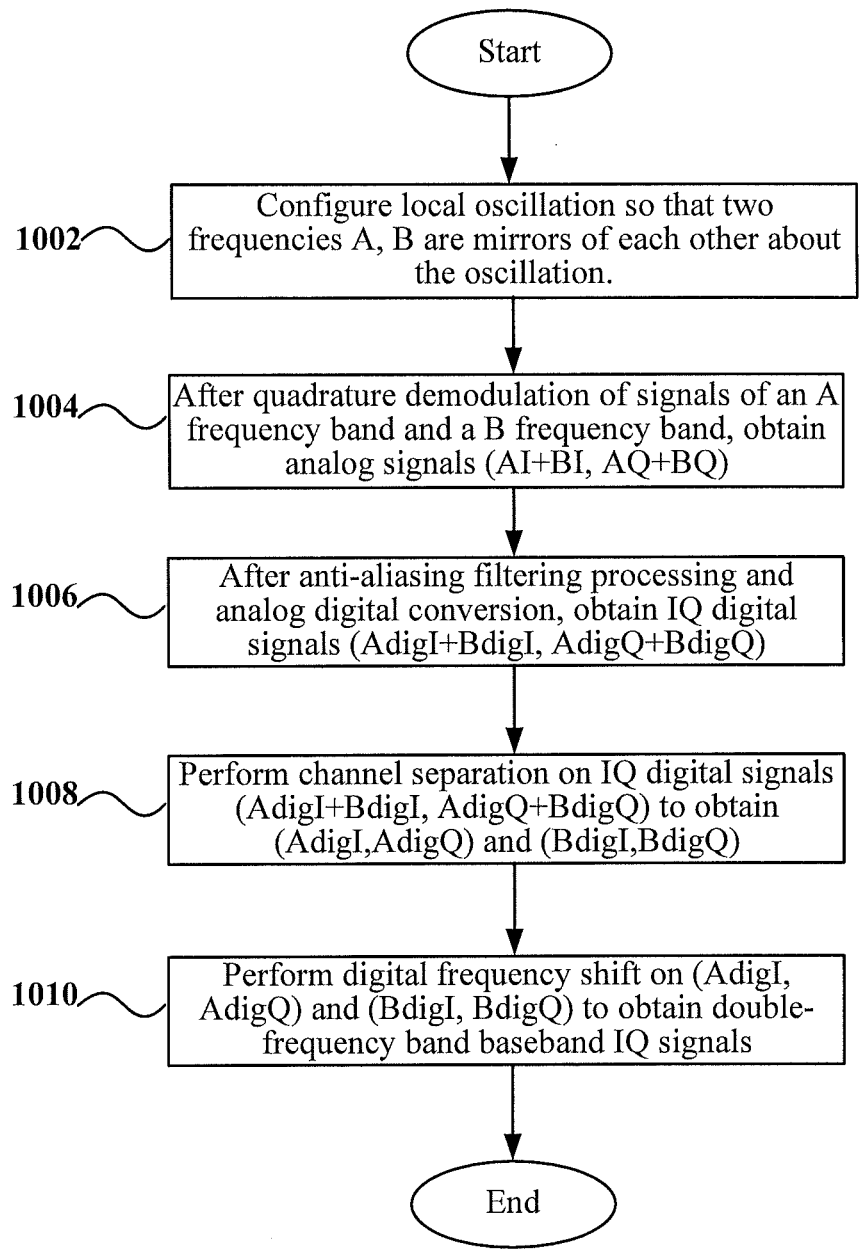
FIG. 10 is a flow chart of another method for receiving a multi-frequency band signal according to an embodiment of the present invention.

FIG. 10 is a flow chart of another method for receiving a multi-frequency band signal according to an embodiment of the present invention.

As shown in FIG. 10, in step 1002, local oscillation 275 is configured with a digital processing module 130, so that two frequency bands A, B are mirrors of each other about an uplink local oscillation frequency.

In step 1004, after a quadrature demodulator 272 demodulates the radio frequency signal including the A frequency band and the B frequency band, multi-frequency band analog signals (AI+BI, AQ+BQ) are obtained, where both AI and BI are output in an I path, and both AQ and BQ are output in a Q path.

In step 1006, the multi-frequency band analog signal AI+BI passes through a first anti-aliasing filter 273 and a first analog digital converter 276 and then a multi-frequency band I digital signal AdigI+BdigI is obtained; a multi-frequency band analog signal AQ+BQ passes through a second anti-aliasing filter 274 and a second analog digital converter 277, and then a multi-frequency band Q digital signal AdigQ+BdigQ is obtained.

In step 1008, channel separation is performed on multi-frequency band I, Q digital signals (AdigI+BdigI, AdigQ+BdigQ) respectively to obtain (AdigI, AdigQ) and (BdigI, BdigQ).

In step 1010, after quadrature error compensation and direct current removal are performed by using (AdigI, AdigQ) and (BdigI, BdigQ), digital frequency shift is performed to obtain respective double-frequency band baseband I, Q signals.

Figure 11:
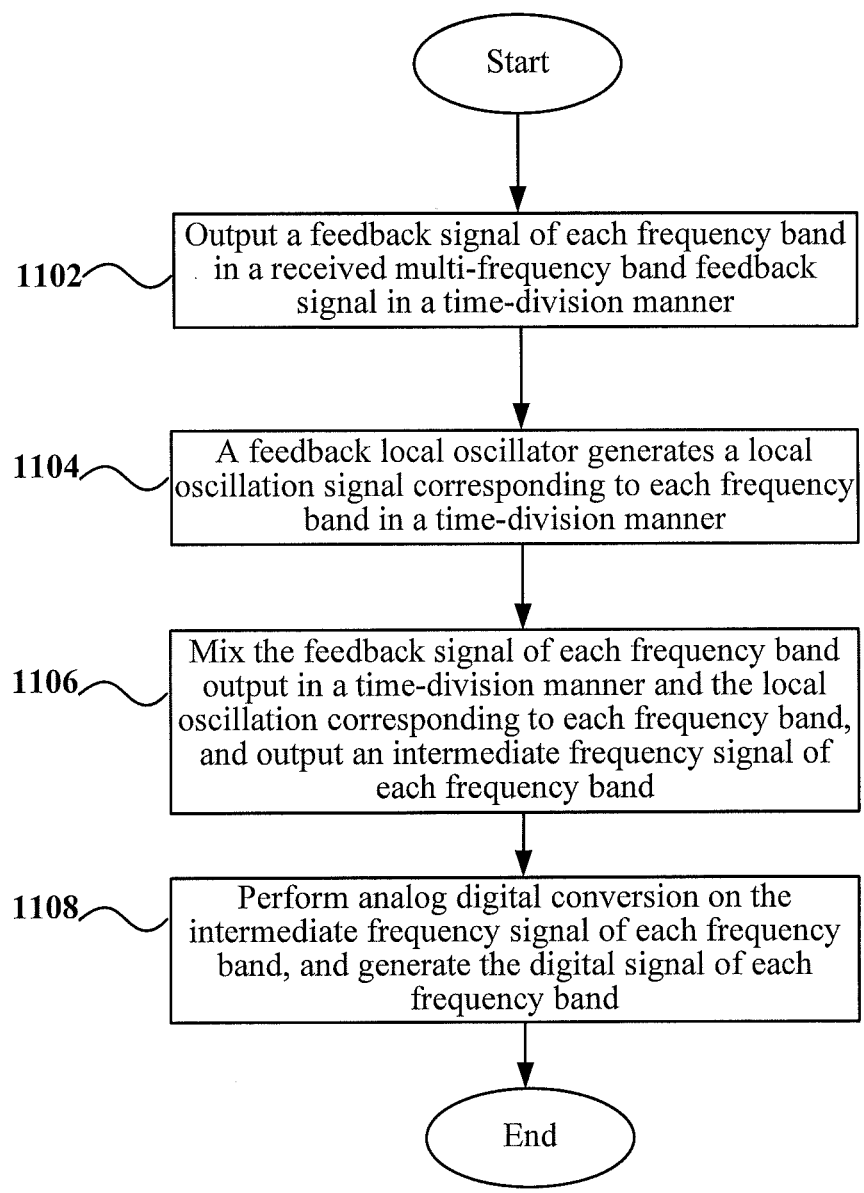
FIG. 11 is a flow chart of a method for processing a multi-frequency band feedback signal according to an embodiment of the present invention.

FIG. 11 is a flow chart of a method for processing a multi-frequency band feedback signal according to an embodiment of the present invention.

As shown in FIG. 11, in step 1102, a feedback signal of each frequency band in a multi-frequency band feedback signal coupled at a transmitter is output through a multi-channel frequency selection band-pass circuit in a time-division manner.

In step 1104, a feedback local oscillator generates local oscillation corresponding to each frequency band in a time-division manner.

In step 1106, the feedback signal of each frequency band output in a time-division manner is mixed with the local oscillation corresponding to each frequency band, and the intermediate frequency signal of each frequency band is output.

In step 1108, analog to digital conversion is performed on the intermediate frequency signal of each frequency band, and the digital signal of each frequency band is generated.

Figure 12:
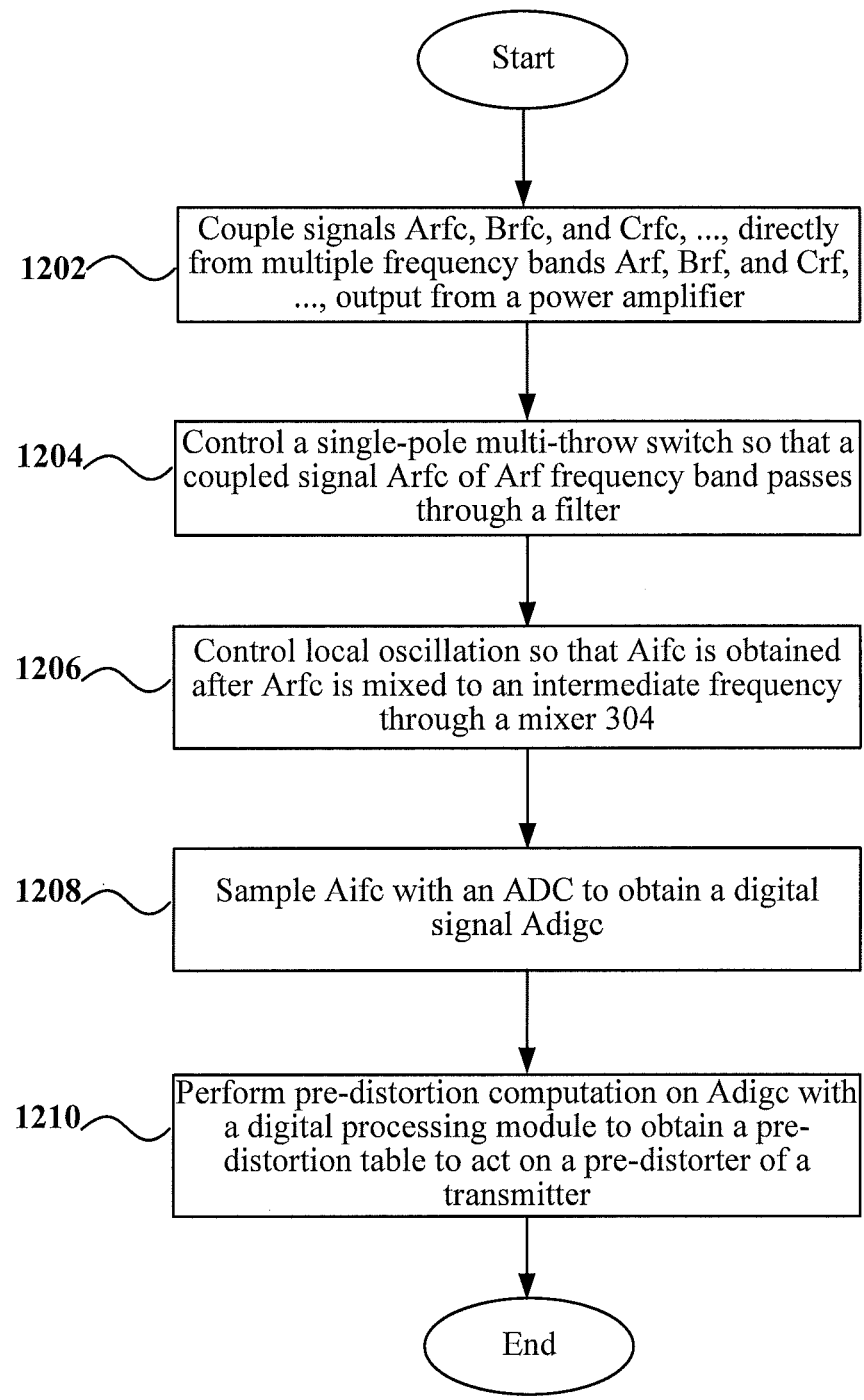
FIG. 12 is a flow chart of another method for processing a multi-frequency band feedback signal according to an embodiment of the present invention.

FIG. 12 is a flow chart of another method for processing a multi-frequency band feedback signal according to an embodiment of the present invention. The procedure is described with reference to FIG. 7.

As shown in FIG. 12, in step 1202, multiple frequency bands Arf, Brf, and Crf, . . . , output from a power amplifier are directly coupled into signals, the coupling attenuation is about dozens of dBs, and coupled signals Arfc, Brfc, and Crfc, . . . , are obtained.

In step 1204, single-pole multi-throw switches 470 and 473 are controlled, so that a coupled signal Arfc of Arf frequency band passes through a frequency band filter.

In step 1206, local oscillation 475 is controlled, so that Arfc passes through a mixer 474 and is mixed to an intermediate frequency to obtain Aifc.

In step 1208, sample the Aifc through a feedback ADC 477 to obtain a digital signal Adigc.

In step 1210, the digital processing module 130 performs pre-distortion computation on Adigc to obtain a pre-distortion table which acts on digital signals (A2I, A2Q) after digital frequency shift by using a pre-distorter, and the A frequency band pre-distortion processing is completed.

Similarly, the process turns to step 1204, the switches 470 and 473 are controlled to perform the same closed-loop processing on a frequency band Brf until step 1210 is completed, and pre-distortion processing on B frequency band is completed; and similarly, the pre-distortion processing on a frequency band Crf is implemented. It should be understood that, the sequence of performing pre-distortion processing on each frequency band may be changed, and the present invention does not limit a specific sequence of the pre-distortion processing.

An embodiment of a method for processing a multi-frequency band feedback signal of the present invention may further include: collecting feedback signals of two frequency bands (for example, a frequency band D and a frequency band E) located in an upper sideband and a lower sideband of downlink local oscillation to obtain Ddigc and Edigc. The digital processing module collects statistics on the correlation on Ddigc and Edigc to obtain a phase calibration signal to act on a multi-frequency band combined I digital signal Iout and a multi-frequency band combined Q digital signal Qout.

Figure 13:
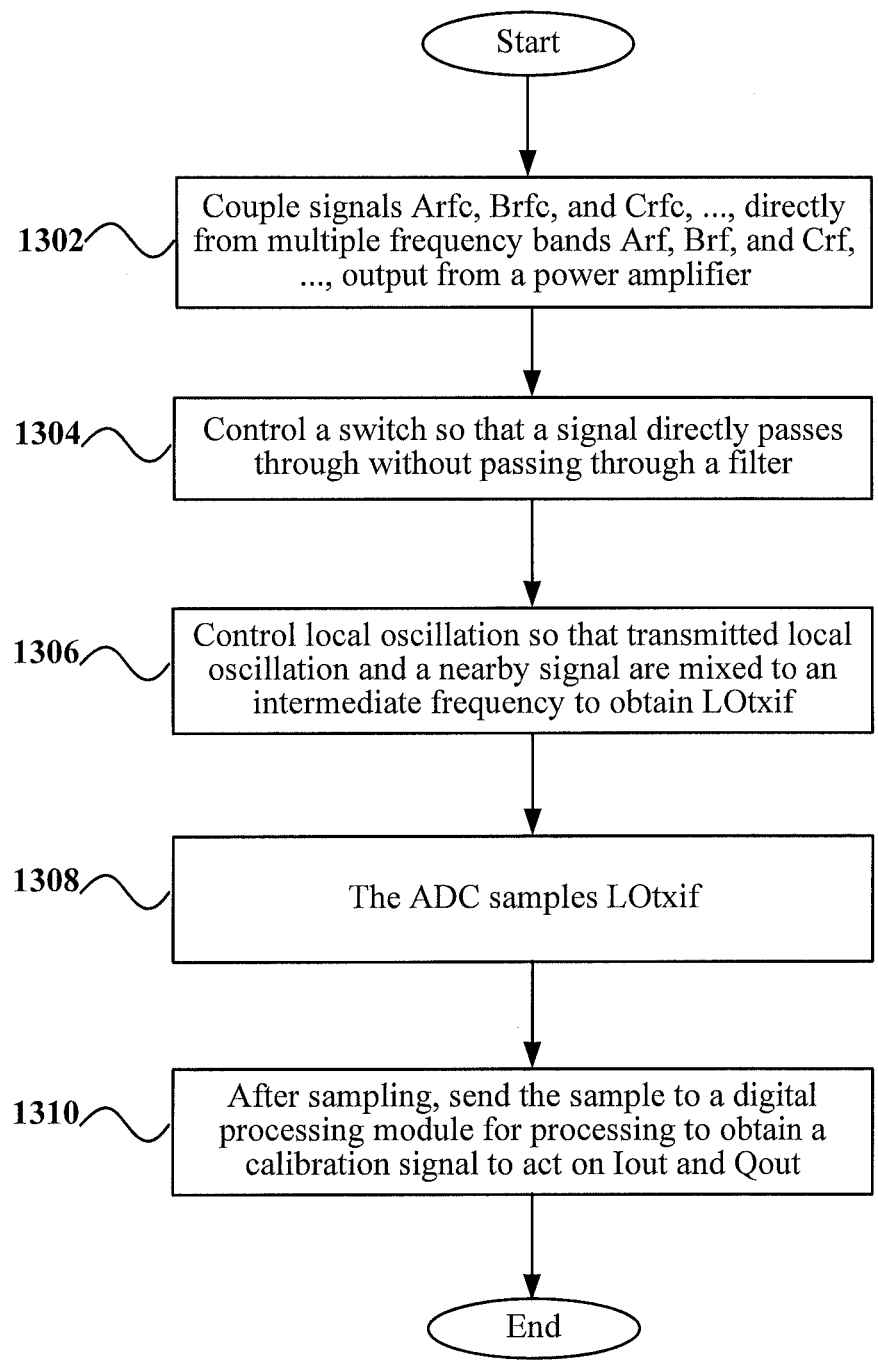
FIG. 13 is a flow chart of performing local oscillation suppression using a method for processing a multi-frequency band feedback signal according to embodiment of the present invention.

FIG. 13 is a flow chart of performing local oscillation suppression through a method for processing a multi-frequency band feedback signal according to an embodiment of the present invention.

As shown in FIG. 13, in step 1302, multiple frequency bands Arf, Brf, and Crf, . . . , output from a power amplifier are directly coupled into signals, the coupling attenuation is about dozens of dBs, and coupled signals Arfc, Brfc, and Crfc, . . . , are obtained.

In step 1304, switches 470 and 473 are controlled so that the signal directly passes through a direct channel 409 instead of a filter.

In step 1306, local oscillation 475 is controlled, so that downlink local oscillation and feedback local oscillation are mixed to a feedback intermediate frequency to obtain LOtxif (a feedback intermediate frequency signal).

In step 1308, a feedback ADC 477 samples LOtxif.

In step 1310, after sampling, sample of LOtxif is sent to a digital processing module 130 for quadrature error and direct current error estimation to obtain a DC offset calibration signal, which acts on a multi-frequency band combined I digital signal Iout and a multi-frequency band combined Q digital signal Qout; and the oscillation suppression is completed.

It should be noted that, the embodiment of the present invention not only may be applied to a base station, but also may be applied to a terminal apparatus. In a telecommunications system according to the embodiment of the present invention, different address access methods may be adopted. The system may use the LTE, the CDMA (Code Division Multiple Access, code division multiple access), the WCDMA (Wide CDMA, wideband code division multiple access) or the TDMA (Time Division Multiple Access, time division multiple access). The embodiments of the present invention are not limited to the transmitter, the receiver, the transceiver, or the feedback radio frequency channel of the transmitter in a telecommunications system. The embodiments of the present invention may be applied to any transmitter, receiver, transceiver, or feedback radio frequency channel of the transmitter.

The sequence numbers in the embodiments of the present invention merely intend to make the description clearer, and do not imply the preference among the embodiments.

Only one set of uplink, downlink and feedback radio frequency channels is used in the method for transmitting a multi-frequency band signal, the method for receiving a multi-frequency band signal, and the method for processing a feedback signal, which are provided by the present invention, to support multiple frequency bands to work synchronously or asynchronously, and the problem that the cost, volume, and power consumption increase significantly because the multi-density telecommunications system supports the multiple frequency bands to work at the same time is solved.

The embodiments of the present invention are provided for exemplification and description, but are not exhaustive or intended to limit the present invention to the disclosed form. The sequence numbers of the embodiments of the present invention are merely intend to make the description clearer, and do not imply the preference among the embodiments. The embodiments are selected and described for illustrating the principle and actual application of the present invention in a better way, and enabling persons skilled in the art to understand the invention and design various embodiments for specific purposes with various modifications.

What is claimed is:

1. A transmitter, comprising:
a digital frequency shifter, configured to perform, on baseband I digital signals and baseband Q digital signals of multiple frequency bands, digital frequency shift to a frequency corresponding to each frequency band, wherein the multiple frequency bands comprise at least two frequency bands;
a combiner, configured to combine the I digital signals of the multiple frequency bands, which are after the digital frequency shift, into a multi-frequency band combined I digital signal, and combine the Q digital signals of multiple frequency bands, which are after the digital frequency shift, into a multi-frequency band combined Q digital signal;
a first digital to analog converter, configured to convert the multi-frequency band combined I digital signal into a multi-frequency band combined I analog signal;
a second digital to analog converter, configured to convert the multi-frequency band combined Q digital signal into a multi-frequency band combined Q analog signal;
a first reconstruction filter, configured to filter the multi-frequency band combined I analog signal;
a second reconstruction filter, configured to filter the multi-frequency band combined Q analog signal;
a downlink local oscillator, configured to provide local oscillation;
a quadrature modulator, configured to modulate the multi-frequency band combined I analog signal and the multi-frequency band combined Q analog signal into radio frequency analog signal of multi-frequency bands by using the local oscillation provided by the downlink local oscillator;
an amplifier, configured to amplify the radio frequency analog signal of multi-frequency bands, to transmit the radio frequency analog signal of multi-frequency bands; and
an error signal acquisition unit to extract an error correction signal for compensation of I and Q digital signals, the error signal acquisition unit comprising:
an analog quadrature modulator (AQM) calibration module, configured to receive digital signals located in at least two frequency bands, an upper sideband and a lower sideband of the downlink local oscillation in each frequency band, and collect statistics on a correlation according to the digital signals of the at least two frequency bands to obtain a phase correction signal as the error correction signal for the I and Q digital signals; and/or
a local oscillation suppressor, configured to receive a direct digital data signal of a direct analog channel from a multi-channel frequency selection band-pass circuit to obtain a first direct current (DC) offset signal and a second DC offset signal as error correction signals for correcting a DC offset of the multi-frequency band combined I digital signal and Q digital signal, respectively.

2. The transmitter according to claim 1, further comprising:
a pre-distortion control module, configured to, for each frequency band,
receive the digital signal of each frequency band output in a time-division manner, and
obtain, from the error signal acquisition unit, a pre-distortion correction signal of each frequency band through pre-distortion computation to compensate for gains of an I digital signal and a Q digital signal of each frequency band.

3. The transmitter according to claim 1, wherein:
the error acquisition unit is further configured to, for each frequency band,
receive the digital signal of each frequency band output by an analog to digital converter, and
extract the error correction signal according to the digital signal of each frequency band to compensate for the I digital signal and the Q digital signal of each frequency band.

4. The transmitter according to claim 3,
wherein the phase correction signal is used for compensating for phases of the multi-frequency band combined I digital signal and Q digital signal, respectively; and
wherein the local oscillation suppressor is configured to
receive the direct digital data signal output after passing through the direct channel and conversion by the analog to digital converter,
perform quadrature demodulation in a digital domain, and
obtain the first DC offset signal and the second DC offset signal.

5. The transmitter according to claim 4, further comprising:
a synchronous control module, configured to synchronize operations of the multi-channel frequency selection band-pass circuit and a feedback local oscillator, so that the feedback local oscillator generates, at one same time slot, feedback local oscillation corresponding to the frequency band of the feedback signal output by the multi-channel frequency selection band-pass circuit in the time slot.

6. The transmitter according to claim 1, wherein bandwidth of the at least two frequency band filter is bandwidth of the frequency band which needs to be passed through multiplied by a pre-distortion order that digital pre-distortion DPD needs.

7. The transmitter according to claim 1, wherein a frequency of a local oscillation of the digital frequency shifter is a central frequency of the multiple frequency bands.

8. A receiver, comprising:
an amplification device, configured to amplify a received radio frequency signal of multi-frequency band, wherein the multi-frequency bands comprise at least two frequency bands;
an uplink local oscillator, configured to provide local oscillation;
a quadrature demodulator, configured to turn the local oscillation provided by the uplink local oscillation oscillator into two quadrature carriers, mix the radio frequency signal of multi-frequency bands received from the amplification device and the two quadrature carriers, respectively, and output a multi-frequency band I analog signal and a multi-frequency band Q analog signal;
a first anti-aliasing filter, configured to perform anti-aliasing filtering on the multi-frequency band I analog signal output from the quadrature demodulator;
a second anti-aliasing filter, configured to perform anti-aliasing filtering on the multi-frequency band Q analog signal output from the quadrature demodulator;
a first analog to digital converter, configured to convert the multi-frequency band I analog signal, which is after the anti-aliasing filtering, into a multi-frequency band I digital signal;

a second analog to digital converter, configured to convert the multi-frequency band Q analog signal which is after the anti-aliasing filtering, into a multi-frequency band Q digital signal;

a channel separation device, configured to separate an I digital signal and a Q digital signal, which are corresponding to each frequency band, from the multi-frequency band I digital signal and the multi-frequency band Q digital signal, respectively; and a digital frequency shifter, configured to perform, on the separated I digital signal and the separated Q digital signal of each frequency band, digital frequency shift into baseband signals.

9. The receiver according to claim 8, wherein a frequency of the local oscillation provided by the uplink local oscillator is a central frequency of the multiple frequency bands.

10. A method for transmitting by a computer implemented transmitter a multi-frequency band signal, the method comprising:

performing, on baseband I digital signals and baseband Q digital signals of multiple frequency bands, digital frequency shift to a frequency corresponding to each frequency band, wherein the multiple frequency bands comprise at least two frequency bands;

combining the I digital signals of multiple frequency bands to obtain a multi-frequency band combined I digital signal;

combining the Q digital signals of multiple frequency bands to obtain a multi-frequency band combined Q digital signal;

converting the multi-frequency band combined I digital signal and the multi-frequency band combined Q digital signal into a radio frequency analog signal of multi-frequency bands; and amplifying the radio frequency analog signal of multi-frequency bands to transmit the radio frequency through a multi-frequency band antenna extracting an error correction signal for compensation of I and Q digital signals, by:

digital signals located in at least two frequency bands, an upper sideband and a lower sideband of the downlink local oscillation in each frequency band, and collecting statistics on a correlation according to the digital signals of the at least two frequency bands to obtain a phase correction signal as the error correction signal for the I and Q digital signals, respectively; and/or receiving a direct digital data signal of a direct analog channel from a multi-channel frequency selection band-pass circuit to obtain a first direct current (DC) offset signal and a second DC offset signal as error correction signals for correcting a DC offset of the multi-frequency band combined I digital signal and Q digital signal, respectively.

11. The method according to claim 10, wherein the converting the multi-frequency band combined I digital signal and the multi-frequency band combined Q digital signal into the radio frequency analog signal of multi-frequency bands comprises:

performing digital to analog conversion on the multi-frequency band combined I digital signal to obtain the multi-frequency band I analog signal;

performing digital to analog conversion on the multi-frequency band combined Q digital signal to obtain the multi-frequency band Q analog signal; and modulating the multi-frequency band I analog signal and the multi-frequency band Q analog signal into the radio frequency analog signal of multi-frequency bands through a quadrature modulator.

12. A method for receiving a multi-frequency band signal, comprising:

demodulating a received radio frequency signal of multi-frequency bands with a quadrature demodulator to obtain a multi-frequency band I analog signal and a multi-frequency band Q analog signal; wherein the multi-frequency bands comprise at least two frequency bands;

performing analog to digital conversion on the multi-frequency band combined I analog signal to obtain a multi-frequency band I digital signal;

performing analog to digital conversion on the multi-frequency band combined Q analog signal to obtain a multi-frequency band Q digital signal;

performing channel separation on the multi-frequency band I digital signal and the multi-frequency band Q digital signal to obtain an I digital signal and a Q digital signal of each frequency band; and obtaining a baseband I digital signal and a baseband Q digital signal of each frequency band according to the I digital signal and the Q digital signal of each frequency band.

13. The method for receiving a multi-frequency band signal according to claim 12, wherein a local oscillation frequency provided for the quadrature demodulator is a central frequency of the multiple frequency bands.

* * * * *